Figure 3:
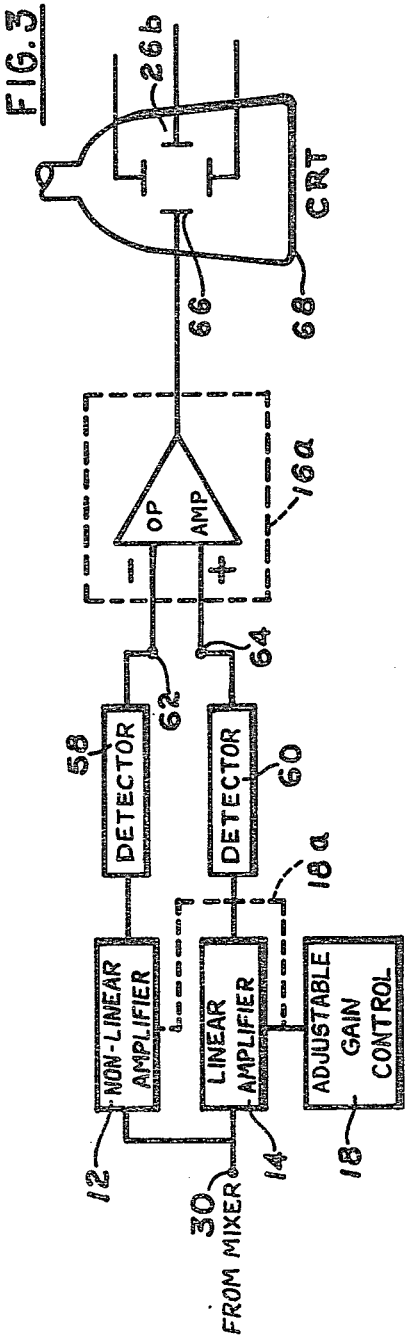

United States Patent [19]

Kubanoff

[11] 4,135,159
[45] Jan. 16, 1979

[54] APPARATUS FOR SUPPRESSING A STRONG ELECTRICAL SIGNAL

[75] Inventor: Jacob H. Kubanoff, Philadelphia, Pa.

[73] Assignee: The United States of America as represented by the Secretary of the Army, Washington, D.C.

[21] Appl. No.: 809,821

[22] Filed: Jun. 24, 1977

Related U.S. Application Data

[63] Continuation of Ser. No. 665,146, Mar. 8, 1976, abandoned.

[51] Int. Cl.² ............................................ H04B 1/10
[52] U.S. Cl. .................................. 325/476; 325/363; 325/397; 330/124 R
[58] Field of Search ................... 325/65, 67, 323, 324, 325/363, 408, 397–404, 472–477; 328/162, 163, 165; 307/335; 343/7 AG, 17.5; 330/124 R

[56] References Cited

U.S. PATENT DOCUMENTS

| 2,858,438 | 10/1958 | Merrill | 307/355 |
| 3,205,443 | 9/1965 | Ludwig | 325/474 |
| 3,213,298 | 10/1965 | Luke | 307/355 |
| 3,226,646 | 12/1965 | Ludwig | 325/475 |
| 3,611,145 | 10/1971 | O'Connor | 325/474 |

Primary Examiner—Robert L. Griffin
Assistant Examiner—Jin F. Ng
Attorney, Agent, or Firm—Nathan Edelberg; A. Victor Erkkila; Max Yarmovsky

[57] ABSTRACT

A strong electrical signal, occurring at the same time as a relatively weaker electrical signal of substantially the same frequency, is suppressed by a method utilizing apparatus wherein (a) the signals are amplified both linearly and non-linearly simultaneously in separate amplifiers, and (b) the outputs of the amplifiers are subtracted from each other while the gain is adjusted in at least one of the amplifiers until the stronger signal is amplified to the same amplitude in each amplifier, leaving the weaker signal isolated as the resultant difference.

4 Claims, 5 Drawing Figures

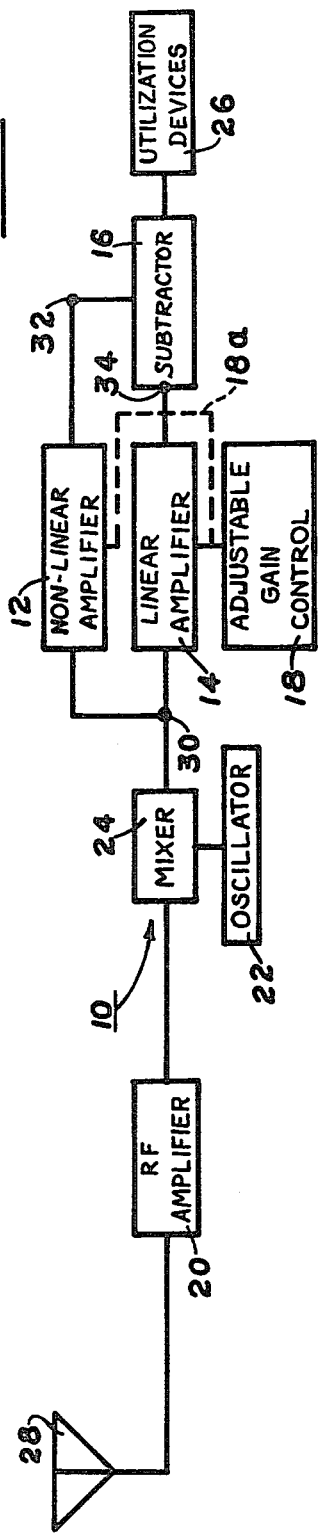
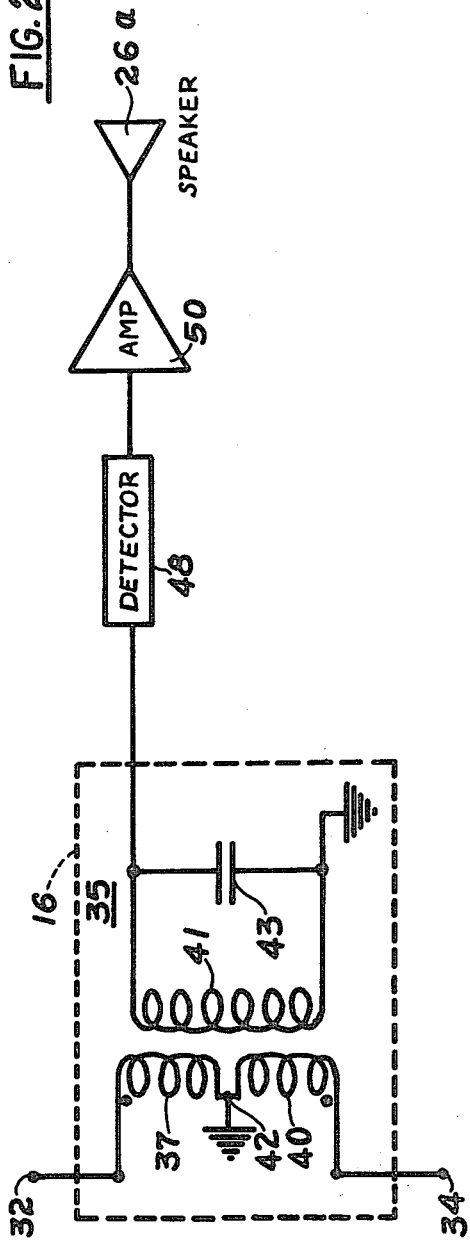

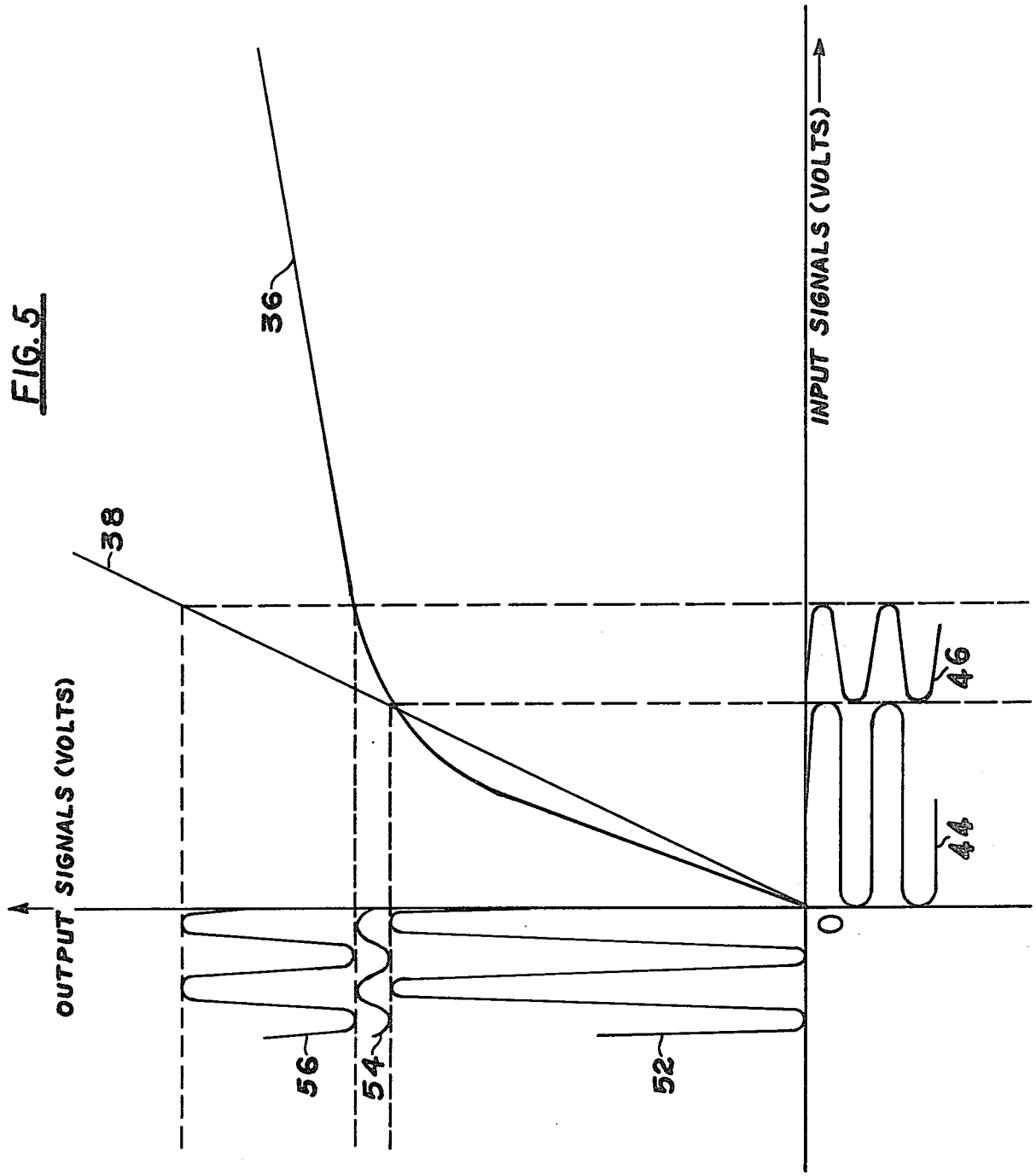

APPARATUS FOR SUPPRESSING A STRONG ELECTRICAL SIGNAL

This is a continuation of application Ser. No. 665,146, filed Mar. 8, 1976, now abandoned.

The invention described herein may be manufactured and used by and for the Government of the United States of America for governmental purposes without the payment to me of any royalties thereon.

The present invention relates generally to apparatus for, and a method of, suppressing a strong electrical signal. More particularly, the invention relates to apparatus for, and a method of, substantially cancelling a relatively stronger, larger amplitude, electrical signal occurring at substantially the same time as a relatively weaker, smaller amplitude, electrical signal of substantially the same frequency so that the weaker signal can be isolated from the stronger one. The present invention is particularly useful for monitoring weak electrical signals in the presence of stronger ones, as for example, in a receiver of the type used for radio or radar communications.

It has been proposed to separate two interfering electrical signals by signal-isolation techniques, such as band limiting, time gating (multiplexing), and phase detecting. Such prior-art techniques, however, leave much to be desired when the interfering signals are of substantially the same frequency. In accordance with the present invention, a weaker signal of two interfering electrical signals of the same frequency can be separated from a stronger electrical signal so that the weaker signal may be easily monitored. In fact, the greater the difference in amplitude between the two interfering signals, the easier it is to separate them by the present invention.

Briefly stated, the novel apparatus comprises two signals processing circuits. The two interfering signals are applied simultaneously to a common input of the two processing circuits. In one processing circuit, the signals are amplified linearly, and in the other processing circuit the signals are amplified non-linearly. A gain control circuit, cooperatively connected to an amplifier in at least one of the processing circuits, is adjusted until the amplitude of the stronger signal is the same in each of the two signal processing circuits. The outputs of the two signal processing circuits are applied to separate inputs of a subtractor circuit, and the weaker signal is obtained at the output of the subtractor circuit as the resultant difference.

In one embodiment of the novel apparatus, the weaker signal is applied to a utilization device from the subtractor circuit which comprises a transformer having a pair of oppositely-wound, serially-connected primary windings.

In other embodiments of the novel apparatus, the signal processing circuit comprise, in addition, either detector or detector and amplifying means. Also, the subtractor circuit can be an operational amplifier. The signal processing circuits may be incorporated in a superheterodyne receiver, and the utilization devices may be a speaker, a cathode ray tube (CRT), a computer, or the like.

Figure 4:
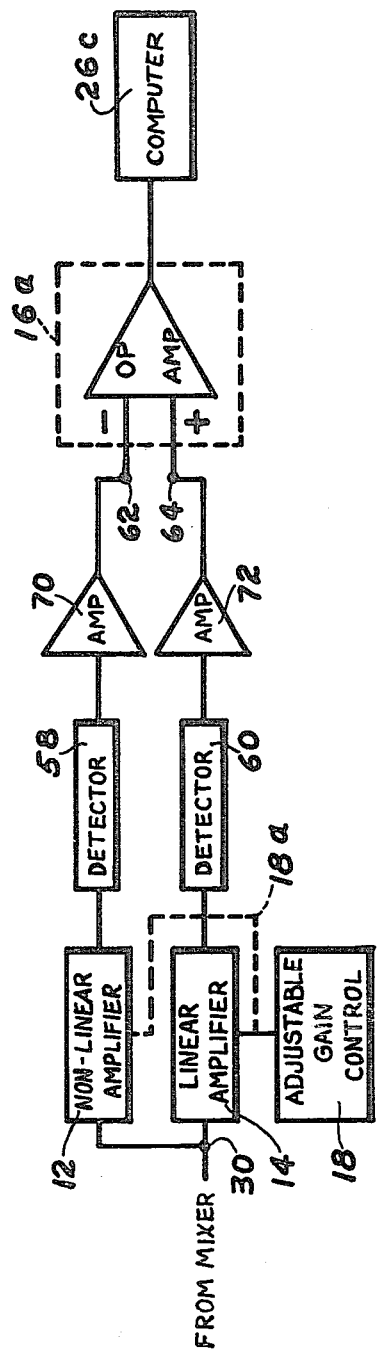

The novel features of the present invention are set forth with particularity in the appended claims. The invention itself, however, both as to its organization and method of operation, together with its objects and advantages may best be understood by references to the following description taken in connection with the following drawing in which similar parts have the same reference designations, and in which:

FIG. 1 is a schematic circuit drawing of a radio receiving circuit including one embodiment of the novel apparatus of the present invention;

FIG. 2, 3, and 4 are schematic circuit drawings including other embodiments of the novel apparatus; and FIG. 5 represents graphically certain characteristics of the novel apparatus that are useful in explaining the operation of the present invention.

The novel apparatus illustrates a few of the arrangements that are possible for carrying out the novel method of suppressing a relatively stronger, larger amplitude, electrical signal, occurring at substantially the same time as a relatively weaker, smaller amplitude, electrical signal of substantially the same frequency as the stronger signal. In accordance with the novel method, both the weaker and the stronger signals are applied simultaneously to a common input of two signal processing circuits. The two signals are amplified simultaneously both linearly and non-linearly in the two signal processing circuits, respectively, and the outputs are applied to separate inputs of a subtractor circuit. In practice, the gain control of an amplifier in at least one of the two signal processing circuits is manually adjusted until the desired smaller output signal is obtained at the output of the subtractor circuit. The latter condition occurs when the manual adjustment or the gain control causes the amplitude of the stronger signal of each of the two signal processing circuits to be substantially the same.

Referring now particularly to FIG. 1 of the drawing, there is shown a superheterodyne-type circuit 10 embodying the novel arrangement of a non-linear amplifier 12, a linear amplifier 14 connected in parallel therewith, and a subtractor circuit 16 having two inputs, each connected to a respective output of the amplifiers 12 and 14. A manually adjustable gain control circuit 18 is cooperatively connected to at least one of the amplifiers 12 and 14. The remainder of the superheterodyne circuit 10 is substantially conventional and comprises an rf (radio-frequency) amplifier 20, a local oscillator 22, a mixer 24, and a utilization device 26, such as a speaker, cathode ray tube, computer, or the like.

In operation, signals, such as radio signals or radar pulses, for example, are picked up by an antenna 28 and applied to the input of the rf amplifier 20 where they are amplified. The amplified rf signals are then applied to the mixer 24 where they are heterodyned with signals from the local oscillator 22 to provide if (intermediate-frequency) signals at the output of the mixer 24. The if signals are applied to a common input terminal 30 for both the non-linear amplfier 12 and the linear amplifier 14.

Signals applied to the common input terminal 30, are acted upon simultaneously by two separate parallel circuits, comprising the non-linear amplifier 12 and the linear amplifier 14, respectively. The output of the non-linear amplifier 12 is applied to one input terminal 32 of the subtractor circuit 16, and the output of the linear circuit 14 is applied to another input terminal 34 of the subtractor circuit 16. The output of the subtractor circuit 16 is applied (by direct or indirect means, as required) to the utilization device 26.

The non-linear amplifier 12 may be of conventional design such as a logarithmic amplifier, for example, having a log-type amplification characterisitc gain curve, such as a curve 36, shown in FIG. 5. The abscissas of the curve 36 are in units of input volts and the ordinates are in units of output volts. When the gain control circuit 18 is connected to the non-linear amplifier 12 (as shown by the connection, dashed line 18a), the knee of the curve 36 can be raised or lowered by manually adjusting the circuit 18. The linear amplifier 14 is also of conventional design and has an amplification characteristic gain curve 38 which is substantially a straight line, as shown in FIG. 5. The slope of the gain curve 38 can be changed by manually adjusting the gain control circuit 18.

The subtractor circuit 16 may be of any conventional type required to process the type of signals to be subtracted from each other. For example, hf (high-frequency) and if signals may be subtracted from each other by a subtractor circuit 16 comprising a split-primary transformer, such as the transformer 35, shown in (FIG. 2). The transformer 35 has a pair of oppositely wound, serially connected, bucking windings 37 and 40 with the common terminal 42 connected to a common connection, such as ground. The input terminals 32 and 34 of the subtractor circuit 16 are connected to the ends of the primary windings 37 and 40, respectively. The primary windings 37 and 40 are coupled to a secondary winding 41 which is shunted by a capacitor 43.

When detected relatively low frequency electrical signals, such as af (audio-frequency) signals, are to be subtracted from each other, they may be operated upon by a subtractor circuit comprising an operational amplifier, such as the subtractor circuits 16a shown in FIGS. 3 and 4, respectively.

Let it now be assumed that it is desired to suppress a relatively stronger, larger amplitude, radio signal, occurring at the same time as a relatively weaker, smaller amplitude, radio signal of the same frequency so that the weaker signal may be more easily monitored, in accordance with the method and apparatus of the present invention. Referring now to FIGS. 1, 2, and 5, let it be assured that the stronger and weaker signals are processed in a conventional manner, well known in the art, in the circuit 10 up to the common terminal 30 of the novel parallel signal processing circuits. Let it also be assumed that the signals at the common terminal 30 are the stronger signal 44 and the weaker signal 46, as shown in FIG. 5. Both of the signals 44 and 46 are now amplified simultaneously and separately by the non-linear amplifier 12 and the linear amplifier 14. Since the outputs of the amplifiers 12 and 14 are subtracted from each other in the subtractor circuit 16, the output of the subtractor circuit 16 is a signal that is the resultant difference of the input signals. Hence, by monitoring the output of the subtractor circuit 16, as, for example, by detecting its output with a conventional audio detector 48 (FIG. 2), conventional audio amplifier 50, and speaker 26a, an operator (while listening to speaker 26a) manually adjusts the gain control circuit 18 (connected to either amplifier 12 or 14) until he hears the weaker signal as loud as the adjustment will allow. Under these conditions, the amplitude of the larger signal 44 is of the same amplitude in each of the amplifiers 12 and 14. Such a condition is shown by the amplified signal 52, shown in FIG. 5. The signal 52 actually represents two identical signals superimposed on each other. The superimposed signals 52 are from the outputs of each of the amplifiers 12 and 14, respectively. Under these conditions, the amplified signal 52 from the non-linear amplifier 12 output is subtracted from the amplified signal 52 from the linear amplifier 14 output in the subtractor circuit 16, thereby cancelling each other. Also, under these conditions, the amplified weaker signal 51 from the output of the non-linear amplifier 12 is subtracted from the amplifed weaker signal 56 from the linear amplifier 14, producing a resultant (difference) output that is predominantly the linearly-amplified weaker signal 56, as shown in FIG. 5. Thus, the amplified weaker signal 56 emerges isolatedly under these conditions because the original weaker signal 46 is added onto the original stronger signal 44 and is amplified near the knee of the logarithmic gain curve 36 in the non-linear amplifier 12, but the weaker signal 46 is also amplified along the (straight line) gain curve 38 in the linear amplifier 14, as illustrated in FIG. 5.

Referring now to FIG. 3, the parallel signal processing circuits, from the common terminal 30 on, are shown for monitoring a relatively weaker signal on a cathode ray tube 26b. In FIG. 3, the signal outputs of the amplifiers 12 and 14 are applied to detectors 58 and 60, respectively, to demodulate them before being applied to the subtractor circuit 16a, the latter comprising an operational amplifier. The subtractor circuit 16a has a differential input of two input terminals 62 and 64 for receiving the signal outputs from the detectors 58 and 60, respectively. The output of the subtractor circuit 16a is applied to a vertical electrode 66 of the tube 26b, as in a radar receiver where incoming signals are viewed along a horizontal sweep, in a manner well known in the art. In practicing the novel method, with the circuit arrangement shown in FIG. 3, the gain of either one (or both) of the amplifiers 12 and 14 is adjusted until the stronger of two interfering radar signals, for example, of the same frequency are cancelled and the weaker signal is visible on the face 68 of the tube 26b.

Referring now to FIG. 4, the novel parallel signal processing circuits are shown including amplifiers 70 and 72 interposed between the outputs of the detectors 58 and 60 and the input terminals 62 and 64 of the (operational amplifier) subtractor circuit 16a. The output of the subtractor circuit 16a is applied to the input of a utilization device illustrated as a computer 26c. In practice, the gain of either one, or both, of the amplifiers 12 and 14 (FIG. 4) is manually adjusted, to separate a weaker incoming signal from a stronger incoming signal of the same frequency, while monitoring the computer 26c. When the weaker signal reaches its greatest amplitude in the computer 26c, a condition has been reached, by the adjustment of the gain control circuit 18, whereby the amplitude of the stronger signal from the output of the non-linear amplifier 12 is substantially equal to that in the linear amplifier 14.

Mathematically, it can be shown that given two signals, S of larger amplitude and W of relatively smaller amplitude, where S is relatively much greater than W, the output (in volts) of the non-linear (logarithmic) amplifer 12 is $$E_{out} = \log S + (1/S)dW.$$

If the gain G of the signal S in the linear amplifier is made equal to the log S (by adjusting the gain control circuit 18) and the outputs of both amplifiers 12 and 14 are subtracted, the result is $$G(S) + G(W) - (\log S + (1/S)dW) = E_{out}$$

But, since $$G(S) = \log S,$$

then $$G(W) - (1/S)\, dW = E_{out}$$

Thus, it is evident from the last equation that the larger S, the strong signal, is; the smaller is the fraction 1/S, and the greater is the output of the weaker signal W.

What is claimed is:

1. Apparatus for suppressing unwanted strong electromagnetic signals and amplifying weak electromagnetic information signals of substantially the same frequency which comprises:

first means for detecting, amplifying and heterodyning all of said electromagnetic signals;
said first means comprising circuit means which includes an antenna, radio-frequency amplifier, mixer and oscillator circuits;
first amplifier means having a input electrically connected to an output of said first means for simultaneously, non-linearly amplfiying all of said electromagnetic signals from said output of said first means;
second amplifier means electrically connected in common to said output of said first means and to an input of said first amplifier means for simultaneously linearly amplifying all of said electromagnetic signals from said output of said first means;
gain control means for simultaneously regulating the gain of said first and second amplifier means to control the amplitude of said unwanted strong electromagnetic signals so that the outputs of said first and second amplifier means for said strong signals are equal;
subtractor circuit means electrically coupled to the outputs of said first and second amplifier means for subtracting said strong signals of equal amplitude from each other to cause cancellation therebetween, and for subtracting from said weak signals amplified by said first and second amplifier means from each other to produce a resultant output, said output comprising a predominantly linearly amplified information signal;
utilization means electrically coupled to said subtractor circuit means for monitoring said resultant output of said subtractor circuit means to adjust said gain control means to maximize the signal strength of said weak information signals thereby isolating said weak signals from said strong signals.

2. An apparatus as recited in claim 1 wherein said first amplifier means comprises a non-linear amplifier having a log-type amplification characteristic gain curve, wherein a knee of said log-type gain curve can be raised or lowered by manually adjusting said gain control means.

3. An apparatus as recited in claim 2 wherein said second amplifier means comprises a linear amplifier having a straight line amplification characteristic gain curve, wherein the slope of said straight line gain curve can be changed by manually adjusting said gain control means.

4. An apparatus as recited in claim 3 wherein said linear and non-linear amplifiers comprise means for adjusting said slope of said straight line gain curve and said knee of said log-type gain curve with respect to each other to produce an output signal from each of said amplifiers for said strong signals which are substantially of the same amplitude, said equal amplitude strong signals being cancelled by said subtractor means for the producing a resultant output from said amplifiers for said weak signals which are not of equal amplitude and which can be detected by said utilization.

* * * * *